(12) United States Patent
Guha et al.

(10) Patent No.: US 9,514,955 B2
(45) Date of Patent: Dec. 6, 2016

(54) PATTERNING OF A HARD MASK MATERIAL

(71) Applicant: Lam Research Corporation, Fremont, CA (US)

(72) Inventors: Joydeep Guha, Danville, CA (US); Camelia Rusu, Pleasanton, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/712,327

(22) Filed: May 14, 2015

(65) Prior Publication Data

US 2015/0364337 A1 Dec. 17, 2015

Related U.S. Application Data

(60) Provisional application No. 62/011,900, filed on Jun. 13, 2014.

(51) Int. Cl.
| | |
|---|---|
| *H01L 21/3105* | (2006.01) |
| *H01L 21/311* | (2006.01) |
| *H01L 21/033* | (2006.01) |

(52) U.S. Cl.
CPC ..... *H01L 21/31144* (2013.01); *H01L 21/0337* (2013.01); *H01L 21/31056* (2013.01)

(58) Field of Classification Search
CPC ............ H01L 21/0337; H01L 21/31144; H01L 21/0338; H01L 21/32139; H01L 21/76802; H01L 21/31138; H01L 21/02164; H01L 21/3088; H01L 21/31055; H01L 21/31056; H01L 21/31111; H01L 21/31116; H01L 21/7682; H01L 45/1691; H01L 21/0273; H01L 21/203; H01L 21/28123; H01L 21/32137; H01L 27/1203; H01L 45/1625
USPC ......................................... 438/702
See application file for complete search history.

(56) References Cited

U.S. PATENT DOCUMENTS

| | | | |
|---|---|---|---|
| 2007/0048674 A1* | 3/2007 | Wells .................... | H01L 27/101 430/313 |
| 2011/0177691 A1* | 7/2011 | Kang .................. | H01L 21/0337 438/694 |

* cited by examiner

*Primary Examiner* — Caleen Sullivan

(57) ABSTRACT

A method for processing a substrate includes providing the substrate including a photoresist/bottom anti-reflection coating (PR/BARC) layer, a hard mask layer, a stop layer, a carbon layer and a stack including a plurality of layers. The method includes defining a hole pattern including a plurality of holes in the PR/BARC layer using photolithography; transferring the hole pattern into the carbon layer; filling the plurality of holes in the hole pattern with oxide to create oxide pillars; using a planarization technique to remove the hard mask layer, a remaining portion of the PR/BARC layer and the stop layer; stripping the carbon layer to expose the oxide pillars; filling space between the oxide pillars with hard a mask material including metal; planarizing at least part of the hard mask material; and stripping the oxide pillars to expose the hole pattern in the hard mask material.

21 Claims, 5 Drawing Sheets

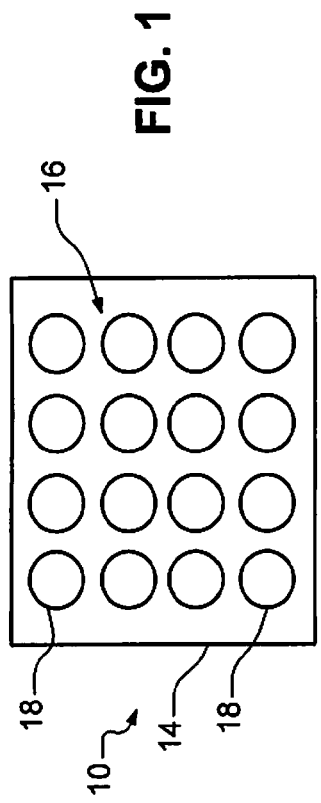
FIG. 1
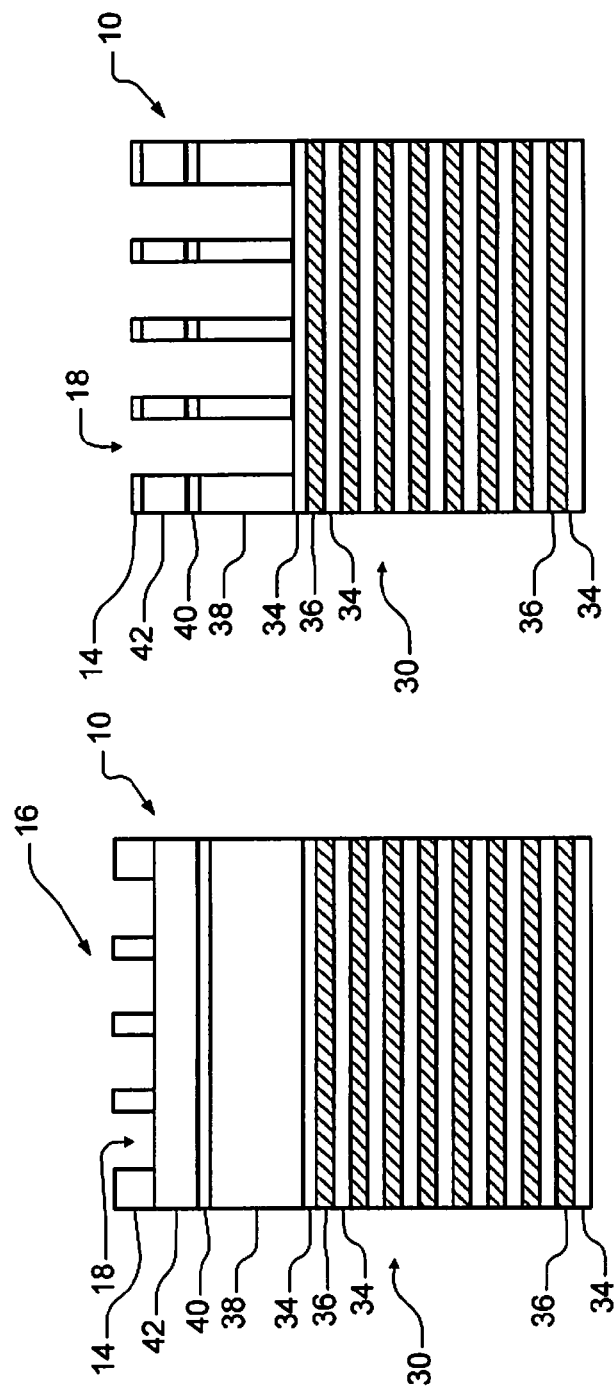
FIG. 2
FIG. 3

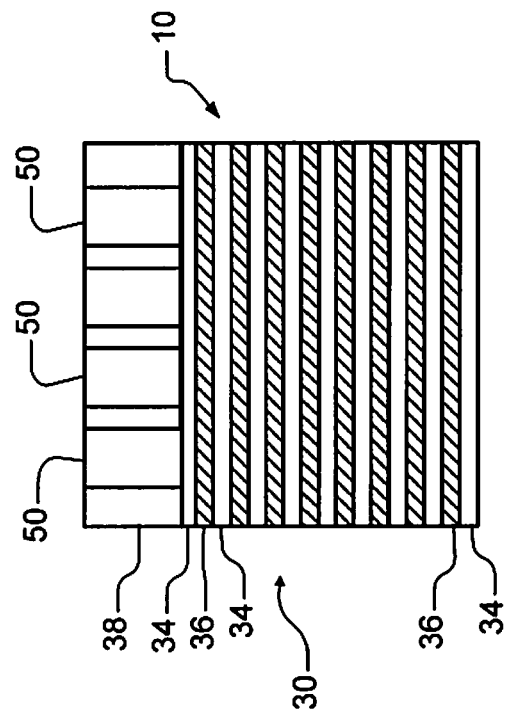
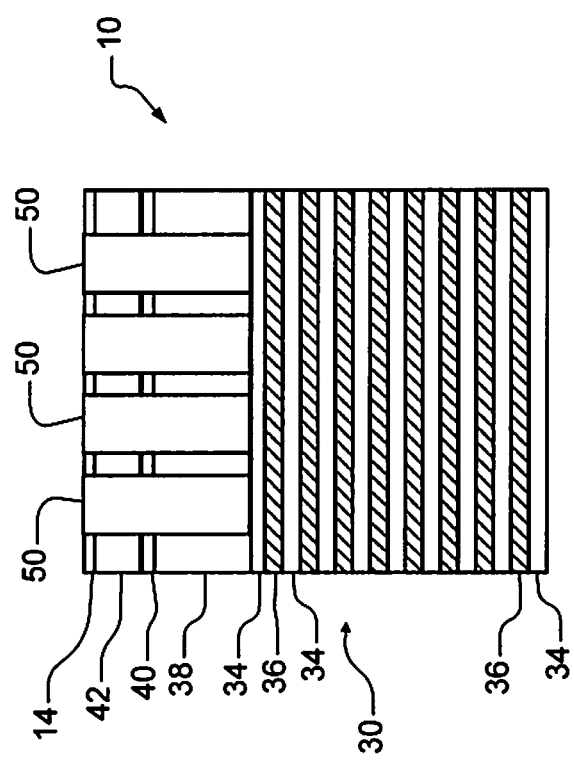

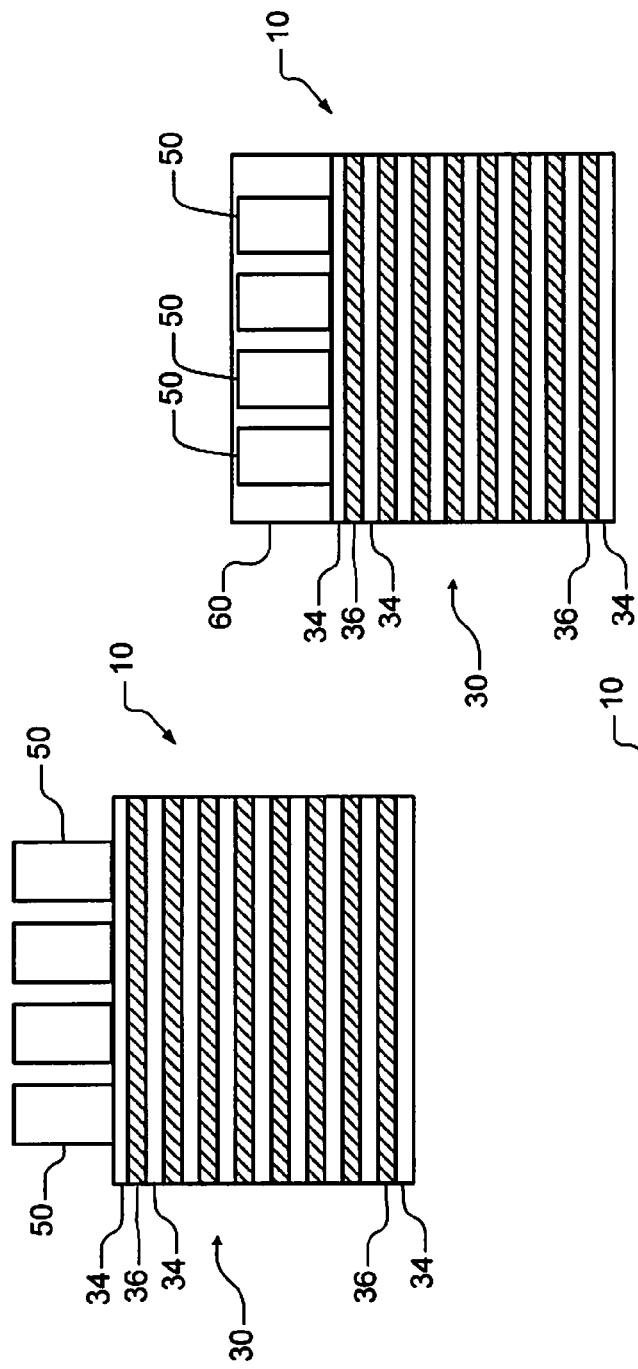

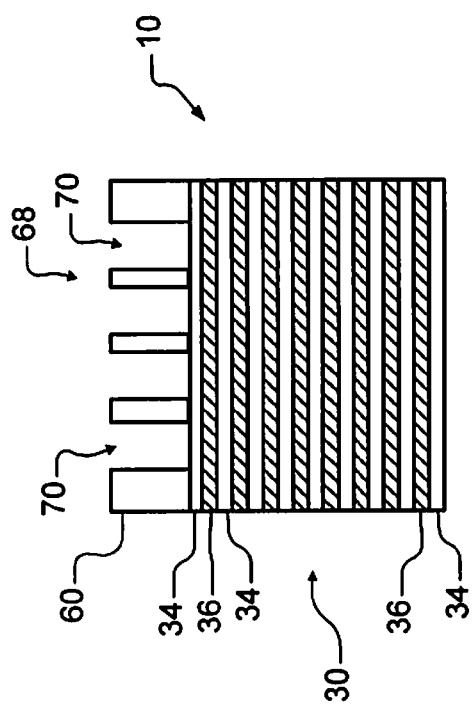
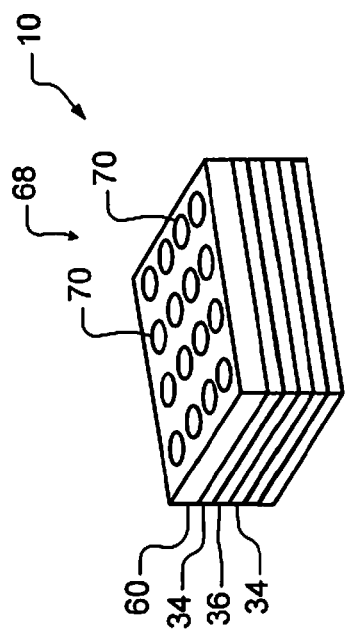
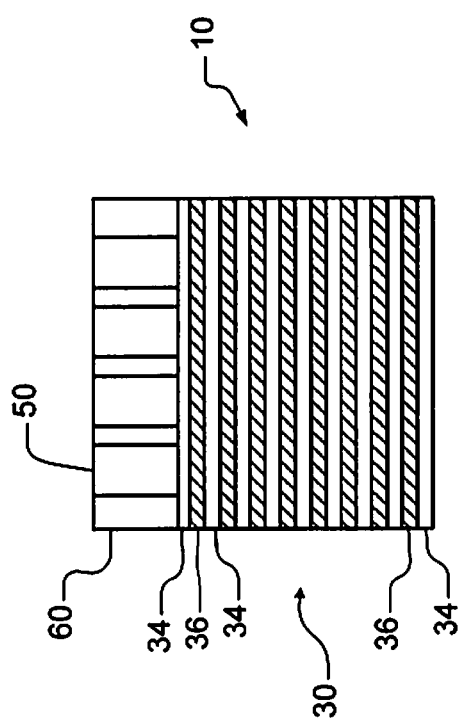

PATTERNING OF A HARD MASK MATERIAL

CROSS-REFERENCE TO RELATED APPLICATIONS

This application claims the benefit of U.S. Provisional Application No. 62/011,900, filed on Jun. 13, 2014. The entire disclosure of the application referenced above is incorporated herein by reference.

FIELD

The present disclosure relates to substrate processing methods, and more particularly to methods for patterning of a hard mask material such as metal.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems increasingly need to use high aspect ratio etching when processing features of substrates such as semiconductor wafers. For example, high aspect ratio etching may be used when processing substrates for dynamic random access memory (DRAM). In these applications, very high aspect ratio cylinders are etched in oxide or poly materials.

With technology shrinking in two dimensional (2D) space and moving towards three dimensional (3D) applications, improved methods for etching high aspect ratio features will be needed. Examples of 3D structures include 3D vertical NAND structures with 2D flash devices that are stacked over each other vertically. 3D scaling also requires very high aspect ratio etching. For example, 3D scaling may be used for memory hole etching in 3D vertical NAND flash applications. There are other applications such as cross-point memory structures where high aspect ratio etching of features is also required.

High aspect ratios generally require high ion energy to etch the high aspect ratio features. At high ion bombardment energy levels, mask selectivity is very important. New mask materials that are harder and have very high etch resistance under high ion bombardment energy levels are therefore being considered. Materials being evaluated as masks include metal or metal-based derivatives. These materials are harder to pattern using plasma etching because the hard mask materials do not have substantial volatile etch byproducts.

SUMMARY

A method for processing a substrate includes providing the substrate including a photoresist/bottom anti-reflection coating (PR/BARC) layer, a hard mask layer, a stop layer, a carbon layer and a stack including a plurality of layers. The method further includes defining a hole pattern in the PR/BARC layer using photolithography; transferring the hole pattern including a plurality of holes into the carbon layer and stopping on the stop layer; and filling the plurality of holes in the hole pattern with oxide to create oxide pillars.

In other features, the method includes using a planarization technique to remove the hard mask layer, a remaining portion of the PR/BARC layer and the stop layer. The planarization technique includes using chemical mechanical polishing.

In other features, the method includes stripping the carbon layer to expose the oxide pillars.

In other features, the method includes filling space between the oxide pillars with a hard mask material including metal. Filling the space includes using physical vapor deposition (PVD), chemical vapor deposition (CVD), atomic layer deposition (ALD) or electroless deposition (ELD). Filling the space includes using chemical vapor deposition (CVD) and the method further includes depositing a glue layer. The glue layer includes a tungsten (W) layer.

In other features, the method includes planarizing at least part of the hard mask material. The planarizing stops on and exposes the oxide pillars.

In other features, the method includes stripping the oxide pillars to expose the hole pattern in the hard mask material. The plurality of layers includes alternating layers of silicon nitride and silicon oxide.

A method for processing a substrate includes providing the substrate including a photoresist/bottom anti-reflection coating (PR/BARC) layer, a hard mask layer, a stop layer, a carbon layer and a stack including a plurality of layers. The method includes defining a hole pattern including a plurality of holes in the PR/BARC layer using photolithography; transferring the hole pattern into the carbon layer and stopping on the stop layer; filling the plurality of holes in the hole pattern with oxide to create oxide pillars; using a planarization technique to remove the hard mask layer, a remaining portion of the PR/BARC layer and the stop layer; stripping the carbon layer to expose the oxide pillars; and filling space between the oxide pillars with a hard mask material including metal.

In other features, the planarization technique includes chemical mechanical polishing. Filling the space includes using physical vapor deposition (PVD), chemical vapor deposition (CVD), atomic layer deposition (ALD) or electroless deposition (ELD). Filling the space includes using chemical vapor deposition (CVD) and the method further includes depositing a glue layer. The glue layer includes a tungsten (W) layer.

In other features, the method includes planarizing at least part of the hard mask material. The planarizing stops on and exposes the oxide pillars.

In other features, the method includes stripping the oxide pillars to expose the hole pattern in the hard mask material.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a plan view of an example of a substrate that is processed to include a hard mask material with high aspect ratio features according to the present disclosure;

FIGS. 2-11 are examples of cross-sectional views illustrating the substrate during various stages of processing to provide a hard mask material such as metal with high aspect ratio features according to the present disclosure.

In the drawings, reference numbers may be reused to identify similar and/or identical elements.

DETAILED DESCRIPTION

Figure 12:
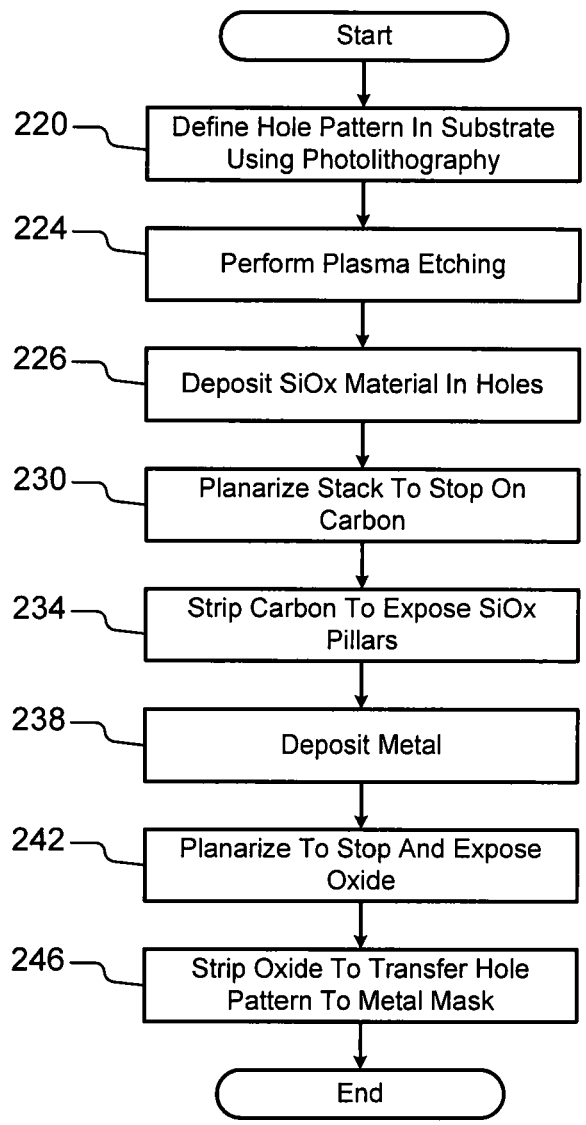
FIG. 12 is an example of a method for creating a hard mask material with high aspect ratio features according to the present disclosure.

The present disclosure relates to patterning hard mask materials such as metal for high aspect ratio features. While specific examples are disclosed herein, the present disclosure applies to other hard mask materials and other applications.

The methods described herein do not employ plasma etching to pattern hard mask materials. Rather, a deposition and planarization approach is used to pattern the hard mask materials. While a specific example for patterning a metal hard mask for an Oxide-Nitride-Oxide-Nitride (ONON) stack is shown, the methods described herein can be used for patterning other hard mask materials that are hard to etch by conventional methods. Also, while methods for forming a hole pattern in the hard mask material are described in the examples set forth below, a similar approach can be employed for defining other patterns such as (but not limited to) square patterns, line/space patterns, etc.

Referring now to FIG. 1, an example of a substrate 10 according to the present disclosure is shown. The substrate 10 includes a photoresist/bottom anti-reflection coating (PR/BARC) layer 14 defining a hole pattern 16 including a plurality of holes 18. The hole pattern 16 may be formed in the PR/BARC layer 14 using photolithography or other similar approaches.

Referring now to FIGS. 2-11, the substrate 10 is shown during various stages of processing according to the present disclosure to provide a hard mask material with high aspect ratio features. In FIG. 2, the substrate 10 includes a stack of layers 30. In some examples, the stack of layers may include alternating silicon nitride (SiN) layers 34 and silicon dioxide ($SiO_2$) layers 36. A carbon layer 38 is arranged on the stack of layers 30.

A stop layer 40 such as a SiN layer is arranged on the carbon layer 38. A hard mask layer 42 is arranged on the stop layer 40. For example only, the hard mask layer 42 may be formed using spin on glass (SoG), tetraethyl orthosilicate (TEOS) or other suitable hard mask layer. The PR/BARC layer 14 is arranged on the hard mask layer 42.

In FIG. 3, plasma etching is used to transfer the hole pattern 16 defined in the PR/BARC layer 14 onto the carbon layer 38 with a stop on the SiN layer 34. In FIG. 4, the hole pattern 16 is filled with silicon dioxide ($SiO_2$) to form oxide pillars 50. In FIG. 5, planarization is used to remove the PR/BARC layer 14, the hard mask layer 42 and the stop layer 40. For example only, techniques such as chemical mechanical polishing (CMP) may be used.

In FIGS. 6 and 7, the carbon layer 38 is stripped to expose the oxide pillars 50. In FIG. 8, space between the oxide pillars 50 is filled with hard mask material 60 that is to be patterned. In some examples, the hard mask material 60 is metal or includes metal. In some examples, physical vapor deposition (PVD), chemical vapor deposition (CVD), atomic layer deposition (ALD) or electroless deposition (ELD) may be used to deposit the hard mask material 60. If CVD is used, a glue layer may be deposited prior to the hard mask material 60. For example only, the glue layer may include a tungsten (W) layer.

In FIG. 9, planarization is performed to remove excess hard mask material 60. Planarization stops on and exposes the oxide pillars 50. In FIGS. 10 and 11, the oxide pillars 50 are stripped and a hole pattern 68 including a plurality of holes 70 is exposed. The plurality of holes 70 may have a high aspect ratio.

Referring now to FIG. 12, at 220 the hole pattern 16 is defined in the PR/BARC layer 14 using photolithography. At 224, plasma etching is used to transfer the hole pattern 16 into the carbon layer 38 and stop on the SiN layer 34. At 226, the plurality of holes 18 in the hole pattern 16 are filled with oxide to create the oxide pillars 50.

At 230, a planarization technique such as chemical mechanical polishing (CMP) is used to remove the hard mask layer 42, a remaining portion of the PR/BARC layer 14 and the stop layer 40 (that acted as stop layer for the CMP). At 234, the carbon layer 38 is stripped to expose the oxide pillars 50.

At 238, the space between the oxide pillars 50 is filled with the hard mask material 60 that will be subsequently patterned. As can be appreciated, physical vapor deposition (PVD), chemical vapor deposition (CVD), atomic layer deposition (ALD) or electroless deposition (ELD). If CVD is used, a glue layer may be deposited prior to metal deposition. For example, the glue layer may include a tungsten (W) layer.

At 242, excess hard mask material 60 is planarized. Planarization stops on and exposes the oxide pillars 50. At 246, the oxide pillars 50 are stripped to expose the hole pattern 68 in the hard mask material 60.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for processing a substrate, comprising:
providing a substrate including a photoresist/bottom anti-reflection coating (PR/BARC) layer, a hard mask layer, a stop layer, a carbon layer and a stack including a plurality of layers;
defining a hole pattern including a plurality of holes in the PR/BARC layer using photolithography;
transferring the hole pattern, as defined in the PR/BARC layer, from the PR/BARC layer into the carbon layer;
filling the plurality of holes in the hole pattern, as defined in the PR/BARC layer and the carbon layer, with oxide to create oxide pillars;
using a planarization technique to remove the hard mask layer, a remaining portion of the PR/BARC layer and the stop layer;
stripping the carbon layer to expose the oxide pillars; and
filling space between the oxide pillars with a hard mask material including metal.

2. The method of claim 1, wherein the planarization technique includes using chemical mechanical polishing.

3. The method of claim 1, wherein filling the space includes using physical vapor deposition (PVD), chemical vapor deposition (CVD), atomic layer deposition (ALD) or electroless deposition (ELD).

4. The method of claim 1, wherein filling the space includes using chemical vapor deposition (CVD) and further comprising depositing a glue layer.

5. The method of claim 4, wherein the glue layer includes a tungsten (W) layer.

6. The method of claim 1, further comprising planarizing excess hard mask material.

7. The method of claim 6, wherein the planarizing stops on and exposes the oxide pillars.

8. The method of claim 1, further comprising stripping the oxide pillars to expose the hole pattern in the hard mask material.

9. The method of claim 1, wherein the plurality of layers includes alternating silicon oxide and silicon nitride layers.

10. A method for processing a substrate comprising:
providing the substrate including a photoresist/bottom anti-reflection coating (PR/BARC) layer, a hard mask layer, a stop layer, a carbon layer and a stack including a plurality of layers;
defining a hole pattern in the PR/BARC layer using photolithography;
transferring the hole pattern including a plurality of holes, as defined in the PR/BARC layer, from the PR/BARC layer into the carbon layer; and
filling the plurality of holes in the hole pattern, as defined in the PR/BARC layer and the carbon layer, with oxide to create oxide pillars,
wherein the oxide pillars are subsequently used to pattern a hard mask material including metal.

11. The method of claim 10, further comprising using a planarization technique to remove the hard mask layer, a remaining portion of the PR/BARC layer and the stop layer.

12. The method of claim 11, wherein the planarization technique includes using chemical mechanical polishing.

13. The method of claim 11, further comprising stripping the carbon layer to expose the oxide pillars.

14. The method of claim 13, further comprising filling space between the oxide pillars with the hard mask material.

15. The method of claim 14, wherein filling the space includes using physical vapor deposition (PVD), chemical vapor deposition (CVD), atomic layer deposition (ALD) or electroless deposition (ELD).

16. The method of claim 14, wherein filling the space includes using chemical vapor deposition (CVD) and further comprising depositing a glue layer.

17. The method of claim 16, wherein the glue layer includes a tungsten (W) layer.

18. The method of claim 14, further comprising planarizing at least part of the hard mask material.

19. The method of claim 18, wherein the planarizing stops on and exposes the oxide pillars.

20. The method of claim 19, further comprising stripping the oxide pillars to expose the hole pattern in the hard mask material.

21. The method of claim 10, wherein the plurality of layers includes alternating layers of silicon nitride and silicon oxide.

* * * * *